(12) United States Patent
Larson

(10) Patent No.: US 6,441,627 B1
(45) Date of Patent: Aug. 27, 2002

(54) SOCKET TEST DEVICE FOR DETECTING CHARACTERISTICS OF SOCKET SIGNALS

(75) Inventor: Corey Larson, Marsing, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/178,924

(22) Filed: Oct. 26, 1998

(51) Int. Cl.⁷ ................................................ G01R 31/02
(52) U.S. Cl. ..................... 324/755; 324/158.1; 324/765
(58) Field of Search .......................... 324/158.1, 73.1, 324/755, 537, 538, 765; 439/912, 66, 70, 482; 714/48, 733, 736, 738; 365/201

(56) References Cited

U.S. PATENT DOCUMENTS

| | | | |
|---|---|---|---|
| 4,646,299 A | | 2/1987 | Schinabeck et al. ............ 371/20 |
| 4,768,195 A | * | 8/1988 | Stoner et al. ................ 714/736 |
| 4,924,179 A | * | 5/1990 | Sherman ...................... 324/537 |
| 4,949,252 A | | 8/1990 | Hauge ......................... 364/200 |
| 4,977,390 A | | 12/1990 | Saylor et al. ................ 340/521 |
| 4,978,912 A | * | 12/1990 | Vonder et al. .............. 324/72.5 |
| 4,985,673 A | * | 1/1991 | Horie ....................... 324/158.1 |
| 5,029,168 A | | 7/1991 | Chan ......................... 371/16.1 |
| 5,036,479 A | | 7/1991 | Prednis et al. .............. 364/580 |
| 5,086,499 A | | 2/1992 | Mutone .......................... 714/3 |
| 5,122,070 A | * | 6/1992 | Lebris et al. ................ 439/912 |
| 5,123,017 A | | 6/1992 | Simpkins et al. .............. 714/26 |
| 5,283,605 A | * | 2/1994 | Lang Dahlke ................ 324/538 |
| 5,331,274 A | * | 7/1994 | Jarwala et al. ............. 324/158.1 |
| 5,426,361 A | * | 6/1995 | Simmons ................... 324/158.1 |
| 5,432,705 A | | 7/1995 | Severt et al. ................ 364/481 |
| 5,436,570 A | * | 7/1995 | Tan ........................... 324/761 |
| 5,459,737 A | * | 10/1995 | Andrews ..................... 714/733 |
| 5,602,750 A | | 2/1997 | Severt et al. ................ 364/481 |
| 5,630,048 A | | 5/1997 | La Joie et al. ................ 714/25 |
| 5,630,049 A | | 5/1997 | Cardoza et al. .......... 395/183.01 |
| 5,864,563 A | | 1/1999 | Ratcliffe ...................... 714/12 |
| 5,884,236 A | * | 3/1999 | Ito ............................. 702/89 |
| 5,949,252 A | | 9/1999 | Taguchi ....................... 326/86 |
| 6,070,255 A | * | 5/2000 | Dell et al. .................... 714/48 |
| 6,194,904 B1 | * | 2/2001 | Clayton et al. ............. 324/754 |

OTHER PUBLICATIONS

Electronic Industries Association, Jedec Standard, "Interface Standard for Nominal 3 V/3.3 V Supply Digital Integrated Circuits," JESD–A, Cover Page, pp. i, 1–4, Jun. 1994.

* cited by examiner

*Primary Examiner*—Vinh P. Nguyen
(74) *Attorney, Agent, or Firm*—Trop, Pruner & Hu, P.C.

(57) ABSTRACT

A test device to determine the operational behavior of a memory module socket may include a connector configured to mate with a memory module socket, a signal detection circuit to detect a power characteristic of a first signal, and an edge detection circuit to detect a transition of a second signal. The test device may provide continuity verification for signals passing through the memory module socket. In another implementation, the test device may include a connector, a signal capture circuit to detect and digitally sample a signal, and a memory to store a value representative of the sampled signal. This device may use a digital signal processor (as the signal capture circuit) to analyze the sampled signal. Test devices may also include an indicator circuit to indicate operation of the signal detection, edge detection, or signal capture circuits.

18 Claims, 3 Drawing Sheets

SOCKET TEST DEVICE FOR DETECTING CHARACTERISTICS OF SOCKET SIGNALS

BACKGROUND

The invention relates generally to the field of electrical component testing and, more particularly, to continuity and integrity testing of signals through an electrical connector.

Many current computer systems use a system circuit board (a motherboard) to host the system's central processing unit, bus bridge circuitry, and other system critical circuitry. Motherboards also typically include a number of sockets (e.g., card edge connectors) through which additional components such as random access memory (RAM), universal serial bus (USB) devices, audio and video devices, network control circuitry, and modems may be coupled. A failure on any pin in any connector may affect the entire computer system.

With today's high speed signals, even a small amount of corrosion or other defect in a socket may cause a component or system failure. Current techniques to locate mechanical failures include probing individual pins within a socket's connector with an oscilloscope or digital logic analyzer. These techniques are both time consuming and may not test the system under operational conditions. Thus, it would be beneficial to provide a mechanism for testing socket connectors by performing signal continuity and integrity testing in an operational setting.

SUMMARY

In one embodiment the invention provides a test device including a connector configured to mate with a memory module socket (the connector having pins to receive signals from the socket), a signal detection circuit to detect a power characteristic of a first signal (for example, voltage or current level), and an edge detection circuit to detect a transition of a second signal (for example, a high-to-low state or a low-to-high state transition). The embodiment may also include an indication circuit to indicate the operation of the detection circuit and the edge detection circuit.

In another embodiment, the invention provides a test device including a connector configured to mate with a memory module socket (the connector having pins to receive signals from the socket), a signal capture circuit to detect and digitally sample a signal on at least one of the pins, and a memory to store a value representative of the sampled signal. This embodiment may also include a routine stored in the memory to direct the signal capture circuit to perform signal integrity analysis on the sampled signal, and/or an indicator circuit to indicate operation of the signal capture circuit, and/or an output circuit to communicate the representation of the sampled signal to a display unit. The integrity analysis may include, for example, signal voltage levels and/or signal transition time analysis.

DETAILED DESCRIPTION

Techniques (including methods and devices) to test the functionality of an electrical connector are described. The following embodiments, described in terms of a dual in-line memory module (DIMM) socket, are illustrative of the inventive concept only and are not to be considered limiting in any respect.

Figure 1:
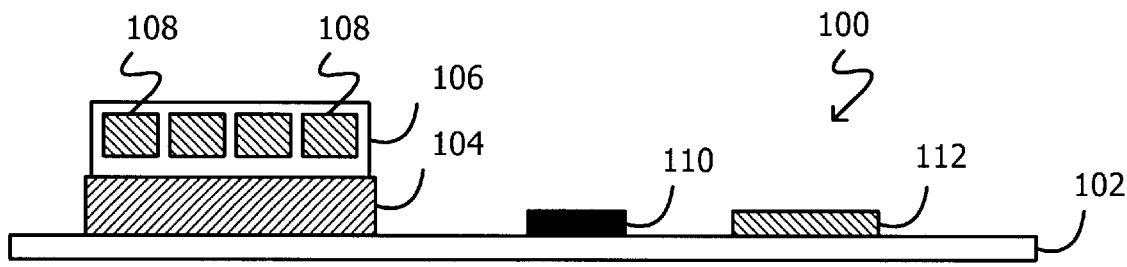
FIG. 1 shows a side view of an illustrative computer system.

Referring to FIG. 1, an illustrative computer system 100 may include motherboard 102, DIMM socket 104, DIMM 106 (having memory circuits 108), central processing unit 110, and other circuitry 112. Diagnostic operations, during or after system 100 assembly/manufacture, may indicate a memory failure. Such a failure may be the result of motherboard 102 failure, dysfunctional socket 104, or dysfunctional DIMM 106. For example, motherboard 102 may be a memory board test system designed to systematically generate memory read and memory write signals to memory circuits 108. (That is, under software control central processing unit 110 may command a series of memory operations to determine if memory module 106 functions properly.)

Figure 2:
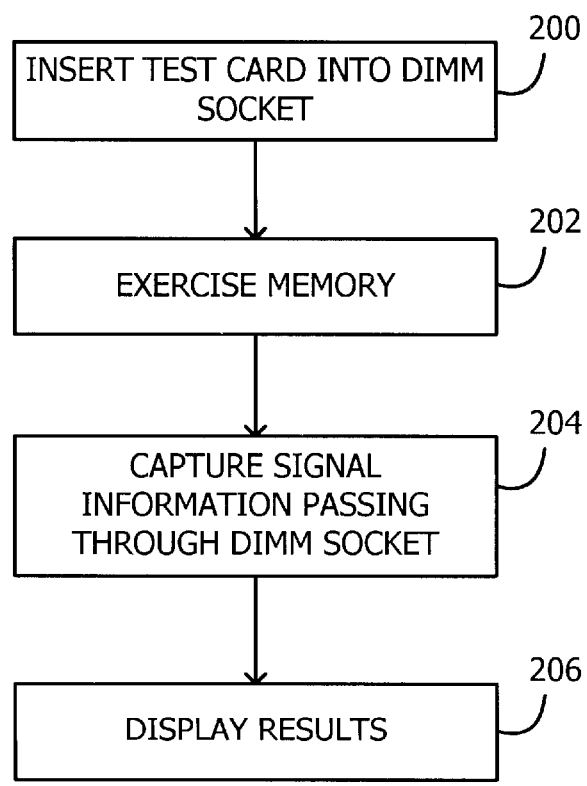
FIG. 2 shows a testing technique in accordance with one embodiment of the invention.

One technique in accordance with the invention to determine if the failure is due to socket 104 is illustrated in FIG. 2. A test device (described below) may be inserted into socket 104 (at 200) and system 100 (e.g., central processing unit 110 under software control) commanded to write to memory circuits 108 as if DIMM 106 were coupled to motherboard 102 through socket 104 (at 202). During memory write operations at 202, the test device captures information about the signals it receives through socket 104 (at 204) and displays the results (at 206).

Figure 3:
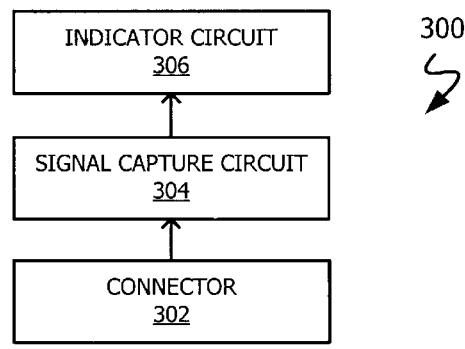
FIGS. 3 shows a test device in accordance with one embodiment of the invention.

Referring to FIG. 3, test device 300 in accordance with one embodiment of the invention may include a connector 302 to couple itself to motherboard 102 through socket 104, a signal capture circuit 304 to capture and/or process signals received through connector 302 (from motherboard 102), and an indicator circuit 306 to display the results of the signal capture operations at 204.

Connector 302 may be any connector compatible with socket 104. For example, if socket 104 is a peripheral component interconnect (PCI) socket, an industry standard architecture (ISA) socket, extended industry standard architecture (EISA) socket, or a single in-line memory module (SIMM) socket, connector 302 must conform to the PCI, ISA, EISA or SIMM standard respectively. For purposes of illustration only, socket 104 and connector 302 may conform to the 168 pin DIMM socket standard as described in the Joint Electron Device Engineering Council (JEDEC) standard, No. 21-C (Published by the Electronics Industries Association). In standard No. 21-C, approximately 49 pins are dedicated to power signals or are not connected, leaving approximately 149 pins dedicated to data and/or address and/or control signals.

Signal capture circuit 304 may include any necessary circuitry to detect and, possibly, process signals it receives from motherboard 102 through socket 104 and connector 302 (see discussion below).

Indicator circuit 306 may be any circuitry capable of indicating or displaying the results generated by signal capture circuit 304. In one embodiment of the invention, indicator circuit 306 may include light emitting diodes (LEDs), 307 (FIGS. 4 and 5) to indicate continuity between motherboard 102 and test device 300 via socket 104/connector 302. For example, the LED 307 (FIGS. 4 and 5) may be illuminated if the pin (in connector 302) it is coupled to exhibits electrical continuity with its complementary pin in socket 104. In another embodiment of the invention, indicator circuit 306 may include an electrical interface, 307 (FIGS. 4 and 5) for displaying signal capture circuit 304 output on a cathode ray tube (CRT) or liquid crystal display (LCD) device. In yet another embodiment, indicator circuit 306 may include an electrical interface 307 (FIGS. 4 and 5) for communicating signal capture circuit 304 output to another device such as a computer system or storage device.

In one embodiment of the invention (see FIG. 4), signal capture circuit 304 may include voltage detection 400 and edge detection 402 circuitry. Voltage detection circuitry 400 may be coupled to those pins in connector 302 through which motherboard 102 provides power (e.g., ground, VCC, VDD, and VSS voltages). Voltage detection circuitry 400 may include circuitry to detect a variety of voltage levels such as, for example, ±3.0 volts (V), ±3.3 V, ±5.0 V ±12 V. One illustrative voltage level detection circuit may include an operational amplifier having the specified voltage level (e.g., 3.3 V) as one input and the signal from socket 104/connector 300 as the other input. Signal capture circuit 304 may also include edge detection circuitry 402 (e.g., D or J-K flip-flops) to detect edge transitions (high to low, and low to high) on address, data, and control pins of connector 302. If the appropriate voltage or signal transitions are detected, signal capture circuit 304 may provide an indication to indicator circuit 306 which may then display the results as described above.

In another embodiment of the invention (see FIG. 5), signal capture circuit 304 may include digital signal processor (DSP) 500, memory 502, remote input-output (I/O) circuit 504, and local output circuit 506. DSP 500 may be designed to sample and digitize signals passing through socket 104 to connector 302. For example, DSP 500 may execute routine 508 (stored in memory 502) to sample all signals and store the sampled data into memory 502. Routine 508 may further provide instructions to cause DSP 500 to analyze the sampled data to determine if the voltage levels and timing characteristics of the sampled signals fall within the appropriate ranges. In the case where socket 104 couples a 3 V or 3.3 V circuit, such as a 3/3.3 V DIMM, JEDEC Standard No. 8-A describes the voltage ranges deemed appropriate or acceptable.

Local output circuit 506 may provide signals to indicator circuit 306 so that results of DSP signal acquisition and analysis may be displayed to a user as described above. Routine 508 may also provide instructions to transmit the collected data to another device (e.g., a computer system) through remote I/O circuit 504. Illustrative remote I/O circuits 504 include serial and parallel ports.

In the embodiment described above, DSP 500 samples every signal passing through socket 104 and connector 300. If the number of signals or the sampling rate needed to characterize the signals (this, of course, depends upon the timing characteristics of the signals and will vary from system to system) is large, a single DSP device may be unable to perform the necessary tasks. In this case, two or more DSP devices may be used to accomplish the same task. Alternatively, power detection circuit 400 may be used to determine if the pins designated to supply voltage (through socket 104) are continuous with connector 302 pins and DSP 500 may be used to only sample address, data, and control signals.

For each pin coupled from socket 104 to connector 300, signal capture circuit 304 determines if socket 104 is operationally intact by measuring a signal and comparing the measured signal against some known value or range. Pins designated to supply power (e.g., voltage) are relatively easy to test because the specified voltage is generally there (socket 104 is functional) or not there (socket 104 is nonfunctional). Similarly, pins dedicated to address, data, and command signals may be tested for continuity (e.g., edge detection) or for signal integrity (e.g., measured voltage levels and transition times). To determine signal integrity characteristics, those pins associated with signals that transition (e.g., from a high state to a low state or a low state to a high state) must be commanded to do so—generally by a device (e.g., processor 110) on motherboard 102.

Figure 4:
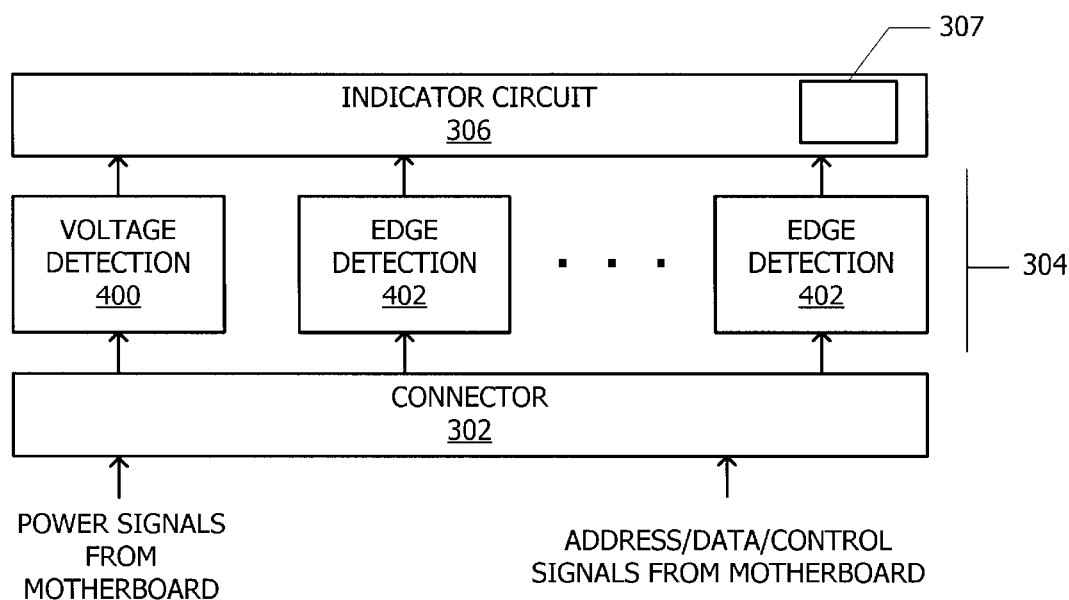
FIG. 4 shows a test device in accordance with another embodiment of the invention.
Figure 5:
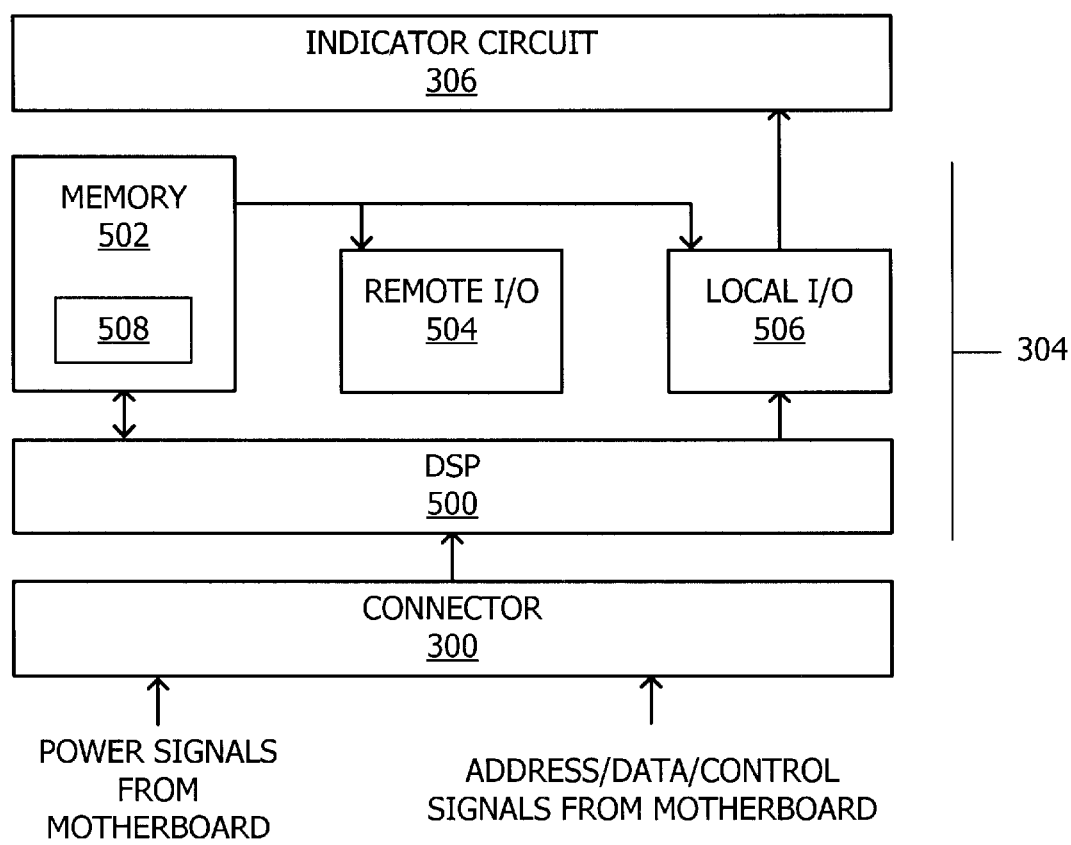
FIG. 5 shows a test device in accordance with yet another embodiment of the invention.

Various changes in the materials, components, circuit elements, as well as in the details of the illustrated operational method are possible without departing from the scope of the claims. For instance, the illustrative systems of FIGS. 3, 4, and 5 are not limited to testing dual in-line memory modules; virtually any type of socket may be tested in accordance with the invention. In addition, acts in accordance with FIG. 2 may be performed by a programmable control device executing instructions organized into a program module (e.g., routine 508 or computer instructions executable by a device coupled to motherboard 102). A programmable control device may be a computer processor or a custom designed state machine. Custom designed state machines may be embodied in a hardware device such as a printed circuit board comprising discrete logic, integrated circuits, or specially designed application specific integrated circuits (ASIC). Storage devices suitable for tangibly embodying program instructions include all forms of nonvolatile memory including, but not limited to: semiconductor memory devices such as EPROM, EEPROM, and flash devices; magnetic disks (fixed, floppy, and removable); other magnetic media such as tape; and optical media such as CD-ROM disks.

What is claimed is:

1. A test device comprising:
   a connector configured for insertion into a memory module socket, the connector having pins to receive signals from the socket, the signals comprising a first signal and a second signal;
   a signal detection circuit, coupled to a first pin, to detect a power characteristic of the first signal to test the memory module socket;
   an edge detection circuit, coupled to a second pin, to detect a transition of the second signal to test the memory module socket; and
   an indicator circuit to indicate the operation of the detection circuit and the edge detection circuit.

2. The test device of claim 1, wherein the memory module socket comprises a dual in-line memory module socket.

3. The test device of claim 1, wherein the power characteristic comprises a voltage level.

4. The test device of claim 1, wherein the transition is a high-state to low-state signal transition.

5. The test device of claim 1, wherein the indicator circuit comprises a light emitting diode device.

6. The test device of claim 1, wherein the indicator circuit comprises a liquid crystal display device.

7. The test device of claim 1, wherein the connector is adapted to be inserted into the memory module socket.

8. The test device of claim 1, wherein the connector is adapted to be mated with the memory module socket, the memory module socket capable of receiving at least one memory device.

9. The test device of claim 8, wherein the connector is adapted to be mated with the memory module socket in place of the at least one memory device.

10. A test device comprising:

a unit comprising a connector for receiving signals comprising a first signal and a second signal from a memory module socket, the unit further comprising a signal capture circuit to capture signals from the connector, the unit adapted to mate with the memory module socket, the signal capture circuit adapted to detect a power characteristic of the first signal and to detect a transition of the second signal to test the memory module socket, the unit further comprising an indicator circuit to indicate an operation of the signal capture circuit.

11. The test device of claim 10, wherein the signal capture circuit is adapted to compare the detected power characteristic with a known range.

12. The test device of claim 10, wherein the signal capture circuit is adapted to measure a transition time of the second signal to determine signal integrity.

13. The test device of claim 10, wherein the signal capture circuit is adapted to detect the power characteristic by determining if a voltage is in a known range.

14. The test device of claim 10, wherein the connector is adapted to be inserted into the memory module socket.

15. The test device of claim 10, wherein the connector is adapted to be mated with the memory module socket, the memory module socket capable of receiving at least one memory device.

16. The test device of claim 15, wherein the connector is adapted to be mated with the memory module socket in place of the at least one memory device.

17. A method of testing, comprising:

attaching a unit having a connector to a memory module socket, the connector to receive signals comprising a first signal and a second signal from the memory module socket;

providing a signal capture circuit to capture signals from the connector;

detecting, with the signal capture circuit, a power characteristic of the first signal to test the memory module socket;

detecting, with the signal capture circuit, a transition of the second signal to test the memory module socket; and indicating operation of the signal capture circuit with an indicator circuit.

18. The method of claim 17, wherein attaching the connector to the memory module socket is performed in place of a memory device capable of being inserted into the memory module socket.

* * * * *